(12) United States Patent
Chen

(10) Patent No.: US 7,336,532 B2
(45) Date of Patent: Feb. 26, 2008

(54) METHOD FOR READING NAND MEMORY DEVICE AND MEMORY CELL ARRAY THEREOF

(75) Inventor: Chung Zen Chen, Hsinchu (TW)

(73) Assignee: Elite Semiconductor Memory, Hsinchu (TW)

( * ) Notice: Subject to any disclaimer, the term of this patent is extended or adjusted under 35 U.S.C. 154(b) by 112 days.

(21) Appl. No.: 11/432,501

(22) Filed: May 12, 2006

(65) Prior Publication Data

US 2007/0263438 A1   Nov. 15, 2007

(51) Int. Cl.
  *G11C 11/34* (2006.01)
  *G11C 16/04* (2006.01)
(52) U.S. Cl. ............... 365/185.03; 365/185.11; 365/189.05; 365/210
(58) Field of Classification Search ........... 365/185.03, 365/185.11, 189.05, 210, 185.33
  See application file for complete search history.

(56) References Cited

U.S. PATENT DOCUMENTS

| 5,754,475 | A | 5/1998 | Bill et al. | |
|---|---|---|---|---|
| 5,768,188 | A | 6/1998 | Park et al. | |
| 5,768,191 | A * | 6/1998 | Choi et al. | 365/185.22 |
| 5,986,929 | A | 11/1999 | Sugiura et al. | |
| 6,671,204 | B2 | 12/2003 | Im | |
| 2005/0018488 | A1 | 1/2005 | Kim et al. | |
| 2005/0213378 | A1 | 9/2005 | Chang | |
| 2006/0245249 | A1 * | 11/2006 | Hwang | 365/185.11 |

* cited by examiner

*Primary Examiner*—Anh Phung
*Assistant Examiner*—Toan Le
(74) *Attorney, Agent, or Firm*—Oliff & Berridge, PLC

(57) ABSTRACT

A method for reading a NAND flash memory device having plural normal cells, which utilizes plural reference bit lines associated with plural reference cells to read the normal cells in one phase to reduce the read time, is disclosed. The method comprises ramping up a selected word line voltage in a predetermined period and reading the normal cells with a zero state, a first state, a second state and a third state in the predetermined period. The present invention also discloses a memory cell array concerning the method for reading a NAND flash memory device. The memory cell array, which utilizes a voltage generator and plural reference cells to read the normal cells in one phase to reduce the amount of precharging and discharging of the normal bit lines, comprises plural normal cell blocks arranged in parallel, plural reference cell blocks interleaved between the normal cell blocks, plural normal bit lines coupled to the normal cell blocks, plural reference bit lines coupled to the reference cell blocks and a voltage generator.

23 Claims, 13 Drawing Sheets

METHOD FOR READING NAND MEMORY DEVICE AND MEMORY CELL ARRAY THEREOF

BACKGROUND OF THE INVENTION

1. Field of the Invention

The present invention relates to a method for reading a NAND flash memory device and a memory cell array thereof, and more particularly, to a method for reading a NAND flash memory device, which stores two-bit information per memory cell and a memory cell array thereof.

2. Description of the Related Art

In a traditional NAND flash memory device, memory cells can take one of two information storing states, namely, the "ON" state and "OFF" state. One bit of information is defined by the ON or OFF state of a respective memory cell. In order to store data of N bits (N: a positive integer of 2 or greater) in the aforesaid traditional NAND flash memory device, N independent memory cells are necessary. When it is required to increase the number of bits of data to be stored in a NAND flash memory device having one-bit memory cells, the number of such memory cells should increase accordingly. Information stored in the one-bit memory cell is determined by the programmed status of the memory cell where programming is used to store the desired information in the memory cell. The information storing state of the memory cell is determined by the threshold voltage which is a minimum voltage to be applied between the gate and source terminals of the transistor included in the memory cell to switch the cell transistor to its ON state.

FIG. 1 shows a threshold voltage distribution of a memory cell according to programmed data. As shown in FIG. 1, a programmed data exhibits one of a threshold voltage (indicating 2-bit data of (11)) lower than −2.0V, a threshold voltage (indicating 2-bit data of (10)) between 0.7V to 1.1V, a threshold voltage (indicating 2-bit data of (01)) between 2.0V to 2.4V, and a threshold voltage (indicating 2-bit data of (00)) between 3.6V to 4.0V. Data can be stored in four different stages in one memory cell on the basis of such threshold voltage distributions.

As for the read operation applied to single level memory cells, U.S. Pat. No. 6,671,204 (hereinafter '204) proposes a method to read the data stored in a memory cell. FIG. 2(a) shows a page buffer of '204, which describes the data flow during the read operation and FIG. 2(b) is a timing chart of the signal commands regarding FIG. 2(a). The detailed read operation is given below. Data is assumed to be read out from one of the memory cells (not shown) and gate control signals of the memory cells to be read apply appropriate voltages to word lines. Reading out is performed directly through a main register 150, bypassing an auxiliary register 170. In order to perform a stable read operation, two bit lines BLE and BLO are first discharged through the transistors N1 and N2 by zeroing a signal VIRPWR, and activating the control signals VBLe and VBLo (refer to Region 1 of FIG. 2(b)). At the same time, a signal PBRST activates from a high logic state to a low logic state to turn on a transistor N5, so that a state of the main register 150 (or an input of an inverter 153) is set to a predetermined state (i.e., a logic high state). Afterwards, entering Region 2, a first control signal PLOAD goes low and the transistor N9 is turned on. The control signal BLSHFe of the transistor N3 is made to have a voltage (e.g., 2.1V) of summing the bit line precharge voltage and a threshold voltage of the transistor N3. After precharging the bit line BLE with an appropriate voltage, the control signal BLSHFe goes to a logic low state of the ground voltage (refer to Region 3). In Region 3, a precharged voltage of the bit line varies according to a state of a selected memory cell. For example, in the case where the selected memory cell is an off cell (i.e., the word line voltage applied is lower than the threshold voltage of the selected memory cell), the precharged voltage of the bit line continues to be maintained. In the case where the selected memory cell is an on cell (i.e., the word line voltage applied is higher than the threshold voltage of the selected memory cell), the precharged voltage of the bit line is discharged. If a voltage of the control signal BLSHFe is changed into an intermediate voltage between the precharge voltage and the previous BLSHFe signal level, a voltage of a node SO is maintained at the source voltage ($V_{cc}$) by shutting off the transistor N3 when the selected memory cell is an off cell. If not, however, a voltage of the node SO is discharged along the bit line BLE voltage. At a midway point where the control signal BLSHFe goes to a logic low state of the ground voltage, the first control signal PLOAD turns to a high logic state. After that, entering Region 4, the signal PBLCHM goes to a high logic state to turn on the transistor N7, and the transistor N6 is turned on or off according to the state of the node SO. As a result, the state of the node SO is stored in the main register 150. Then, the data stored in the main register 150 is transferred to a data line 131 via the transistor N8, which is controlled by the signal PBDO, and next via a Y-gating circuit 130 (Region 6).

As for the read operation applied to a multi-level memory cell, U.S. Pat. No. 5,754,475 (hereinafter '475) proposes a multi-level-cell reading method. FIG. 3 is a simplified block diagram of a read circuit of '475 associated with the memory cells of one block. The memory cells MC11 through MCnm of the array 112 are arranged in the form of a matrix. The memory cells MC11, MC12, . . . MC1m are arranged in the same row and have their selection terminals connected to the same common word line $WL_1$. This is likewise done for each of the remaining rows in the array 112. Also, the memory cells MC11, MC21 . . . MCn1; the memory cells MC12, MC22 . . . MCn2; . . . and the memory cells MC1m, MC2m, . . . MCnm are arranged in the same respective columns and have their corresponding data terminals connected to associated common bit lines $BL_1$, $BL_2$ . . . $BL_n$, respectively. Three reference bit lines 122a through 122c per page are used for four-level cells. Each reference bit line 122 has a reference cell RC at the intersection with each word line WL. The threshold voltage of the reference cells RC on a page are tuned to the targeted value while the page program is instructed, and the reference cells RC are programmed with the normal cells MC concurrently. The reference cells have the threshold voltages RT0, RT1 and RT2 as shown in FIG. 1. To distinguish the four levels (i.e., four states of (11), (10), (01) and (00)) in a memory cell, the read operation needs to repeat three times (i.e., three phases) and each read operation is performed as shown in FIG. 2(b). In Phase 1, the MSB (most significant bit) of the two-bit data stored in the memory cells with the states of (11), (10), (01) and (00) is read. In Phase 2, the LSB (least significant bit) of the two-bit data stored in the memory cells with the states of (11) and (10) is read. In Phase 3, the LSB of the two-bit data stored in the memory cells with the states of (01) and (00) is read. The reading sequence of the read operation of '475 is shown in FIG. 4(a).

In U.S. Pat. No. 5,768,188 (hereinafter '188), a read method regarding a multi-level-cell NAND memory device is disclosed. The read method employs three phases with different constant word line voltages to distinguish one of the four states stored in a memory cell without reference cells. The LSB of the two-bit data stored in the memory cells with the states of (01) and (00) is detected in Phase 1 with the selected word line voltage of 2V; then, the MSB of the two-bit data stored in the memory cells with the states of (11), (10), (01) and (00) is detected in Phase 2 with the selected word line voltage of 1V; finally, the LSB of the two-bit data stored in the memory cells with the states of (11) and (10) is read in Phase 3 with the selected word line voltage of 0V. The reading sequence of the read operation of '188 is shown in FIG. 4(b).

In U.S. Pat. No. 2005/0018488 (hereinafter '488), a read method regarding a multi-level-cell NAND memory device is disclosed. The read method also employs three phases with different constant word line voltages to distinguish one of the four states stored in a memory cell without reference cells. The read sequence is different from those of '475 and '188. The LSB of the two-bit data stored in the memory cells with the states of (01) and (00), the LSB of the two-bit data stored in the memory cells with the states of (11) and (10) and the MSB of the two-bit data stored in the memory cells with the states of (11), (10), (01) and (00) are read in Phases 1, 2 and 3, respectively. The three different selected word line voltages are 2V, 0V and 1V for Phases 1, 2 and 3, respectively. The reading sequence of the read operation of '488 is shown in FIG. 4(c).

In U.S. Pat. No. 5,986,929 (hereinafter '929), a read method regarding a multi-level-cell NAND memory device is disclosed. The read method also employs three phases with different constant word line voltages to distinguish one of the four states stored in a memory cell without reference cells. The read sequence is different from those of '475, '188 and '488. The LSB of the two-bit data stored in the memory cells with the states of (11) and (10), the MSB of the two-bit data stored in the memory cells with the states of (11), (10), (01) and (00) and the LSB of the two-bit data stored in the memory cells with the states of ((01) and (00) are read in Phases 1, 2 and 3, respectively. The three different selected word line voltages are 0V, 1.2V and 2.4V for Phases 1, 2 and 3, respectively. The reading sequence of the read operation of '929 is shown in FIG. 4(d).

SUMMARY OF THE INVENTION

The objective of the present invention is to provide a method for reading a multi-level-cell NAND flash memory device, which utilizes plural reference bit lines associated with plural reference cells to read the normal cells in one phase to reduce the read time.

Another objective of the present invention is to provide a memory cell array concerning the method for reading a multi-level-cell NAND flash memory device, which utilizes a voltage generator and plural reference cells to read the normal cells in one phase to reduce the number of precharging and discharging of the normal bit lines. Thus, the read time is reduced.

In order to achieve the objectives, a method for reading the multi-level-cell NAND flash memory device and a memory cell array performing the same are disclosed. The method of the present invention, which reads a multi-level-cell NAND flash memory device having a plurality of normal cells, comprises the steps of: (a) ramping up a selected word line voltage in a predetermined period; and (b) reading the normal cells with a zero state, a first state, a second state and a third state in the predetermined period, wherein each of the zero state, the first state, the second state and the third state indicate a two-bit data stored in each of the normal cells.

The present invention also discloses a memory cell array, which is used in a multi-level-cell NAND flash memory device. The memory cell array comprises: (1) a plurality of normal cell blocks arranged in parallel, each normal cell block comprising a plurality of normal cells, each normal cell exhibiting one of a zero state, a first state, a second state and a third state; (2) plurality of reference cell blocks interleaved between the normal cell blocks; (3) a plurality of normal bit lines coupled to each of the normal cell blocks; (4) a plurality of reference bit lines coupled to each of the reference cell blocks; and (5) a voltage generator generating a ramp-up word line voltage applied on a selected word line in a predetermined period, wherein the normal cells associated with the selected word line exhibiting the zero state, the first state, the second state and the third state are read in the predetermined period.

BRIEF DESCRIPTION OF THE DRAWINGS

The invention will be described according to the appended drawings in which.

DETAILED DESCRIPTION OF THE INVENTION

The memory cell array of the present invention is described first to help understand the method for reading a multi-level-cell NAND flash memory device of the present invention.

Figure 5:
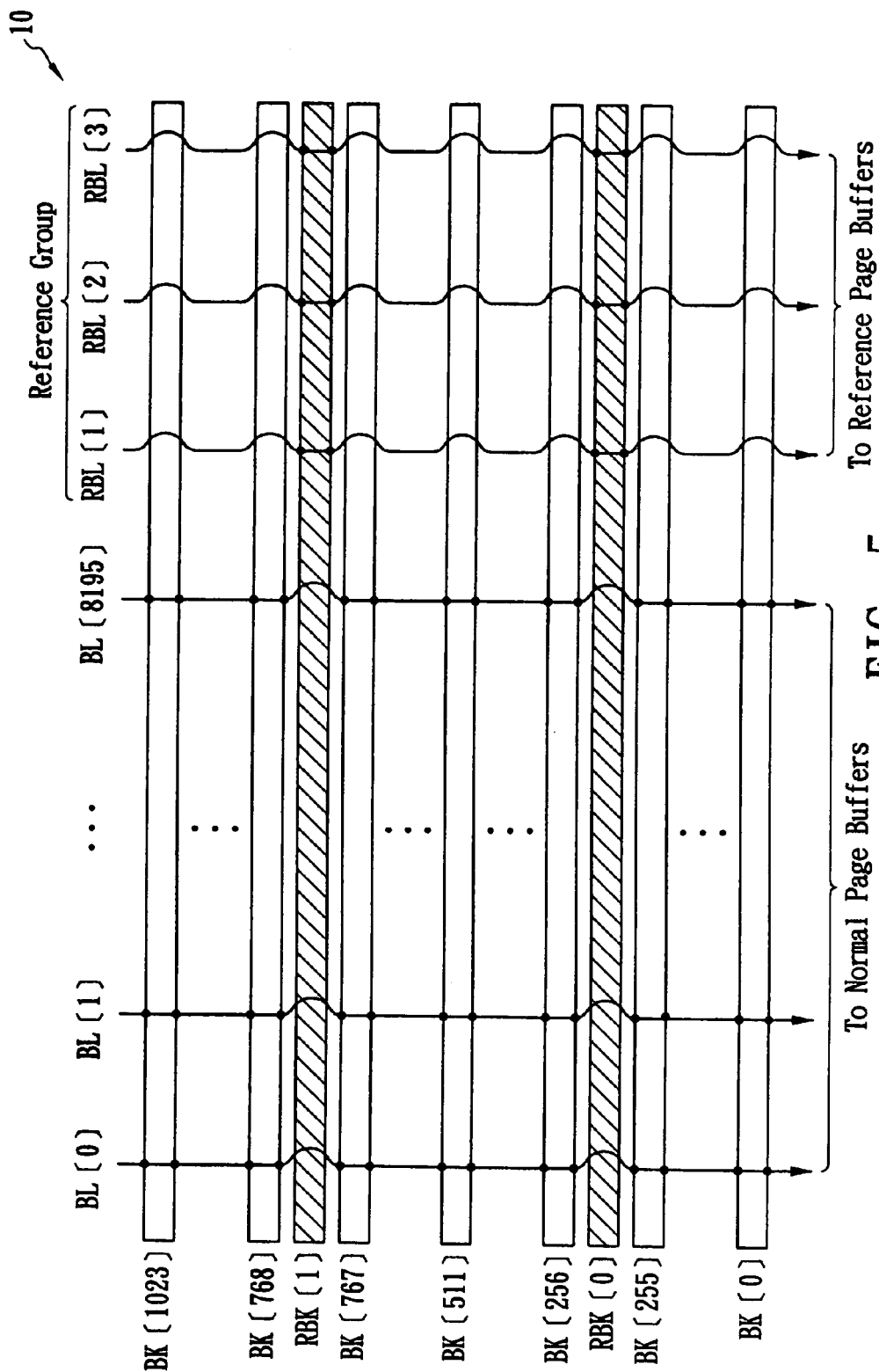
FIG. 5 shows an embodiment of the memory cell array of the present invention.

FIG. 5 shows an embodiment of the memory cell array 10 of the present invention. In the current embodiment, the memory cell array 10 comprising 1024 normal cell blocks (BK[0] through BK[1023]) arranged in parallel, two reference cell blocks RBK[0] and RBK[1] interleaved between the normal cell blocks (i.e., RBK[0] interleaved between BK[255] and BK[256]; RBK[1] interleaved between BK[767] and BK[768]), 8196 normal bit lines (BL[0] through BL[8195]) coupled to each of the normal cell blocks BK and coupled to a plurality of normal page buffers (not shown), three reference bit lines (RBL[1] through RBL[3]) coupled to each of the reference cell blocks RBK[0] and RBK[1], and a voltage generator (not shown). Each normal cell block BK comprises a plurality of normal cells (not shown) and each normal cell exhibits one of a zero state, a first state, a second state and a third state. In the current embodiment, the states of (11), (10), ((01) and (00) are assigned to be the zero state, the first state, the second state and the third state, respectively. The location of the reference cell blocks is arranged to reduce the normal bit line resistance-capacitance loading delay along the normal bit line. For example, the two reference cell blocks RBK[0] and RBK[1] are interleaved between the normal cell blocks BK[255] and BK[256], and between the normal cell blocks BK[767] and BK[768], respectively, such that when any one of the first half blocks (i.e., from BK[0] to BK[511]) is selected for reading, the reference cell block RBK[0] is active and when any one of the second half blocks (i.e., from BK[512] to BK[1023]) is selected for reading, the reference cell block RBK[1] is active. Also, the size of each reference cell block RBK is the same as that of the normal cell block BK and the number of the reference word lines is the same as that of the normal cell block. The voltage generator generates a ramp-up word line voltage applied on a selected word line in a predetermined period, and the normal cells, which are associated with the selected word line and exhibit the zero state, the first state, the second state and the third state, are read in the predetermined period. The reference bit lines RBL[1] through RBL[3] are coupled to three reference page buffers (not shown). In another embodiment, six reference bit lines are arranged and every two reference bit lines are coupled to one reference page buffer with one reference bit line as a shielding reference bit line. In addition, three reference bit lines are considered a reference group and a page can employ one or multiple reference groups depending on the word line resistance, the RC (product of resistance and capacitance) delay and the ramp-up rate of the word line voltage.

Figure 6:
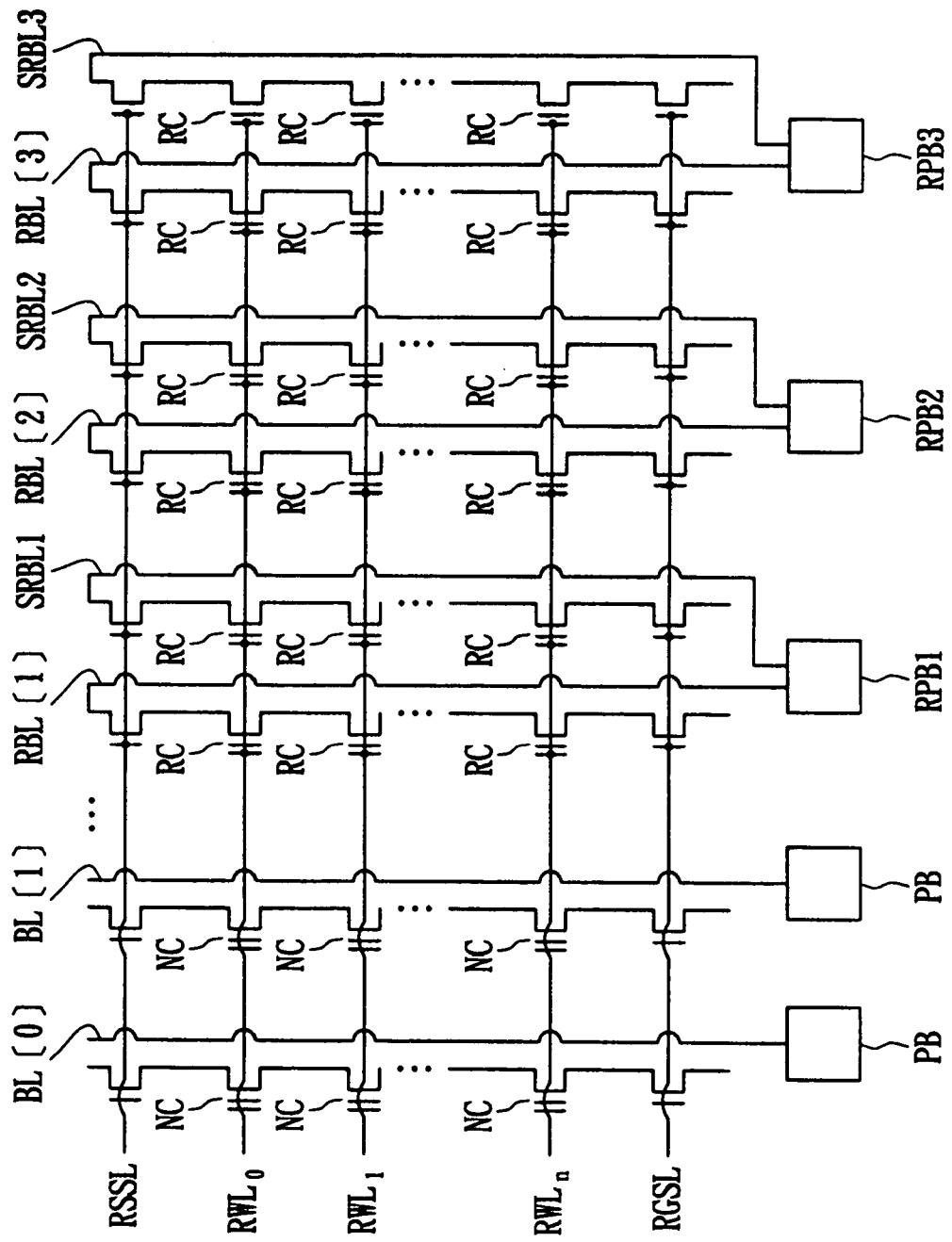
FIG. 6 shows an embodiment of the reference cell block in FIG. 5.

FIG. 6 shows an embodiment of the reference cell block in FIG. 5. The reference cell block comprises three reference bit lines RBL[1] through RBL[3], three shielding reference bit lines SRBL1 through SRBL3, three reference pager buffers RPB1 through RPB3, a plurality of normal pager buffers PB, a plurality of reference word lines $RWL_0$, $RWL_1$, ..., and $RWL_n$, a reference string select line RSSL, and a reference ground source line RGSL. Each normal pager buffer PB is coupled to a plurality of normal cells NC connected in series through the associated normal bit line BL. Each of the reference page buffer RPB1, RPB2 and RPB3 is coupled to a plurality of reference cells RC connected in series through the associated reference bit line RBL and the associated shielding reference bit line SRBL. Each of the reference word lines $RWL_0$, $RWL_1$, ..., and $RWL_n$, the reference string select line RSSL and the reference ground source line RGSL are electrically connected to the control gate of each reference cell RC on the same row, but electrically insulated from the normal cells NC. The three reference cells RC associated with the reference bit lines RBL[1], RBL[2] and RBL[3] on one reference word line (e.g., $RWL_0$, called as an assigned reference word line) are pre-trimmed by a trimming procedure to three targeted threshold voltage distributions such as the states of (A), (B) and (C) in FIG. 1, respectively; and the other reference cells RC on the other reference world lines (e.g., $RWL_1$ . . . and $RWL_n$) are programmed to (00) state with a threshold voltage above 3.6V. The normal cells NC in the reference cell blocks are not connected to the normal bit line BL and the reference bit lines RBL are not connected to the normal cell blocks. Note that the assigned reference word line has the same voltage level as the selected normal word line voltage during the read operation. In another embodiment, each normal page buffer PB is coupled to two normal bit lines and one of the two normal bit lines acts as a shielding bit line. The reference cells RC are divided into three groups and each group of the reference cells RC is coupled to the associated reference page buffer RPB. Each group of the reference cells RC have a pre-trimmed threshold voltage distribution that distinguishes the threshold voltage distributions of the zero, the first, the second and the third states. For example, if the states of (11), (10), ((01) and (00) correspond to the threshold voltage distributions shown in FIG. 1, the pre-trimmed threshold voltage distributions of each group of the reference cells RC is indicated by (A), (B) and (C) that can distinguish the states of (11), (10), (01) and (00). Note that the physical layouts of each reference bit line RBL, each shielding reference bit line SRBL and the reference cells RC thereof are identical to those of each normal bit line BL and the normal cells NC thereof.

Figure 7:
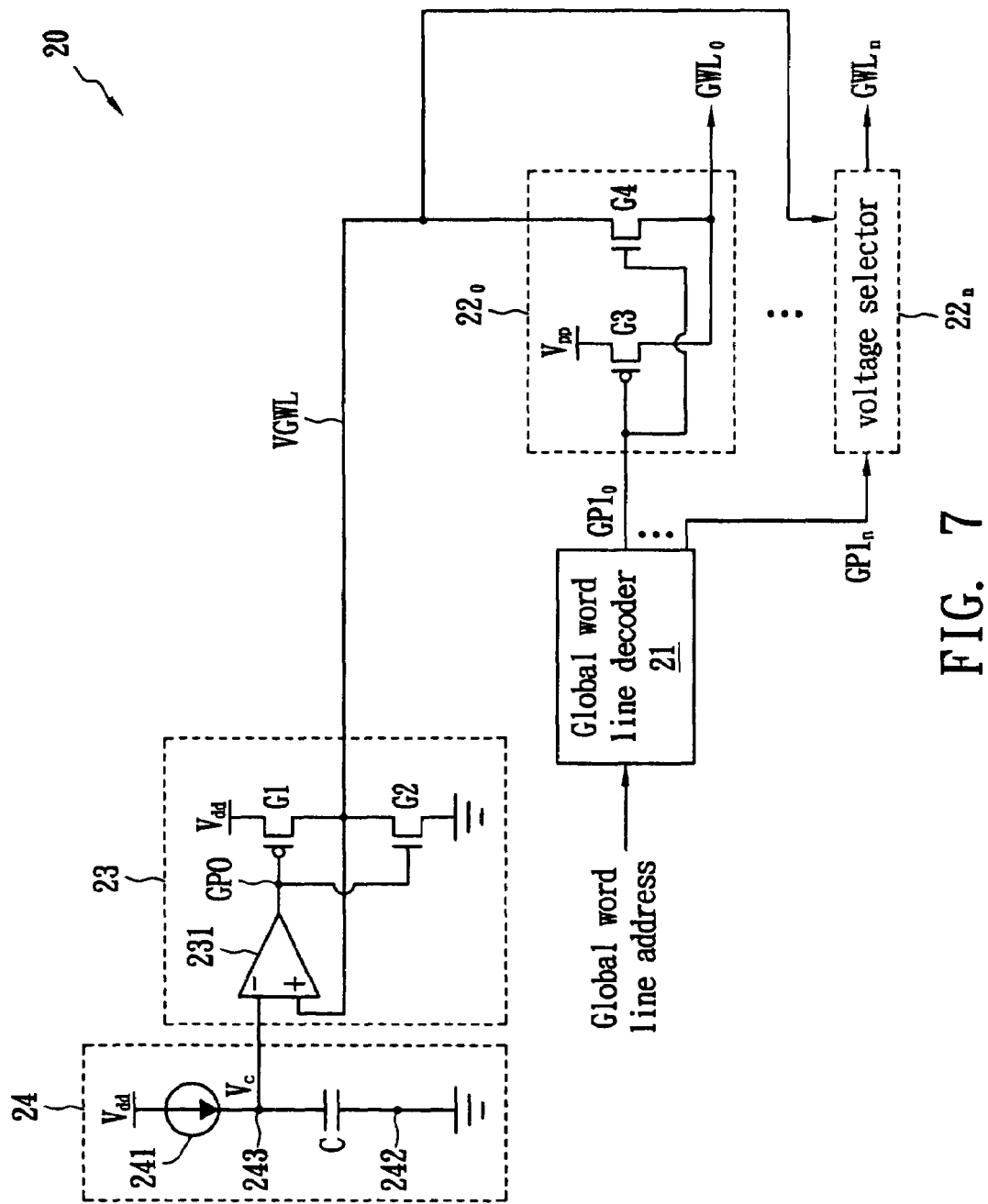
FIG. 7 shows an embodiment of the voltage generator.

FIG. 7 shows an embodiment of the voltage generator 20. The voltage generator 20 comprises a voltage source 24, a voltage equalizer 23, a plurality of voltage selectors $22_0$ through $22_n$ and a global word line decoder 21. The voltage source 24 comprises a capacitor C connecting to the ground with a first node 242 and a current source 241, which charges the capacitor C through a second node 243. The voltage source 24 is used to generate a first voltage $V_c$ at the second node 243. The voltage equalizer 23 provides the ramp-up word line voltage VGWL, which is equalized by the first voltage $V_c$. The first voltage $V_c$ at the second node 243 is linearly increasing and is fed into a comparator 231 with the ramp-up word line voltage VGWL. The output signal GP0 of the comparator 231 is then fed into an inverter comprising the transistors G1 and G2 to equalize the ramp-up word line voltage VGWL and the first voltage $V_c$. The voltage selectors $22_0$ through $22_n$ send the ramp-up word line voltage VGWL to the selected word line and to the assigned reference world line, and send a pass word line voltage $V_{pp}$, which is above 4.0V to ensure that all the normal cells NC are turned on during the read operation in the current embodiment, to a plurality of pass word lines (i.e., unselected word lines) and to the other reference world lines (i.e., unassigned reference world lines) according to a plurality of word line selection signals $GP1_0$ through $GP1_n$. The global word line decoder 21 receives a global word line address and outputs the word line selection signals $GP1_0$ through $GP1_n$.

Figure 8:
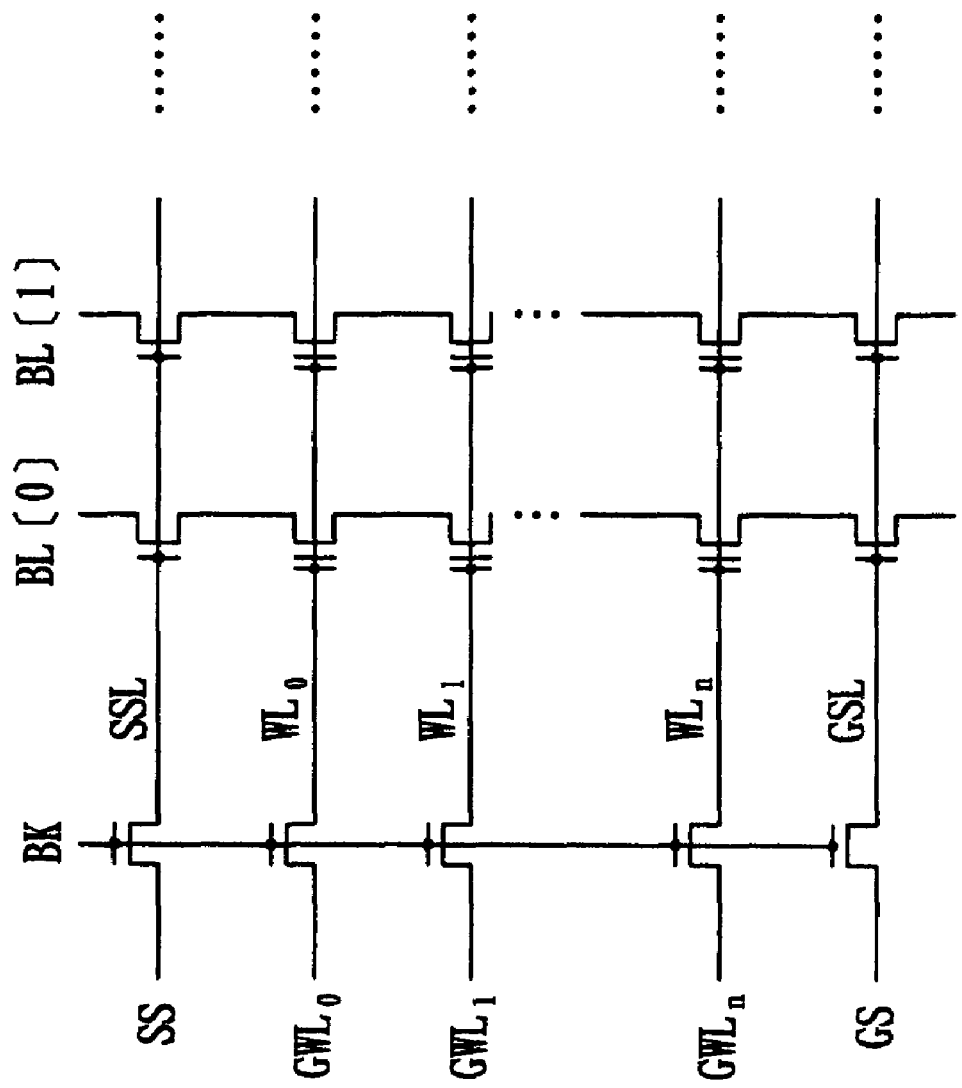
FIG. 8 illustrates a signal transmission diagram connecting the voltage generator and the normal cell block.

Referring to FIGS. 7 and 8, after receiving the global word line address, the global word line decoder 21 determines which word line to be the selected word line (e.g., $WL_0$) to have the ramp-up word line voltage VGWL and the others (e.g., $WL_1$, through $WL_n$) to be pass word lines to have the pass word line voltage $V_{pp}$ according to the word line selection signals $GP1_0$ through $GP1_n$ (e.g., with $GP1_0$ at logic high state and $GP1_1$ through $GP1_n$ at logic low state). The output signals $GWL_0$ through $GWL_n$ of the voltage selectors $22_0$ through $22_n$ will pass to the corresponding word lines $WL_0$ through $WL_n$ with the block signal BK in a logic high state (refer to FIG. 8, a signal transmission diagram connecting the voltage generator 20 and the normal cell block). Thus, the ramp-up word line voltage VGWL is delivered to the selected word line (e.g., $WL_0$). That is, the selected word line voltage is ramping during the read operation.

Figure 9:
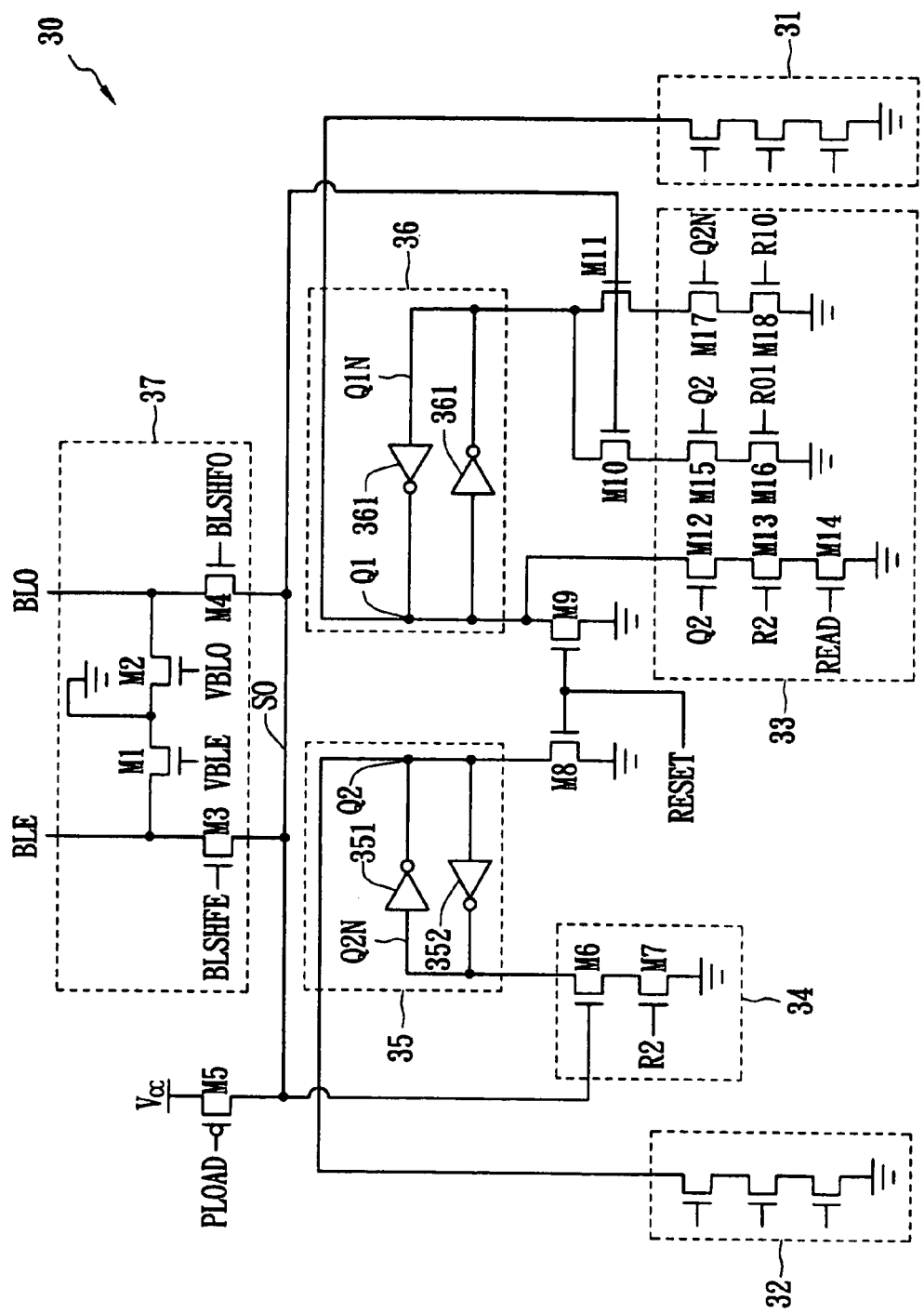
FIG. 9 shows an embodiment of the normal page buffer used in the memory cell array of the present invention.

FIG. 9 shows an embodiment of the normal page buffer 30 used in the memory cell array of the present invention. The normal page buffer 30 comprises a bit line selection circuit 37, a first register 36, a second register 35, a first control circuit 33, a second control circuit 34, a first output circuit 31 and a second output circuit 32. The bit line selection circuit 37 is used to determine the shielding bit line. The first and the second registers 36 and 35 are used to latch a two-bit data storing in the associated normal cell. The first and the second control circuits 33 and 34 are used to output the MSB and LSB of the two-bit data to the first and the second output circuits 31 and 32, respectively, according to a first read signal R10, a second signal R2 and a third signal R01 (refer to FIG. 11).

Figure 10:
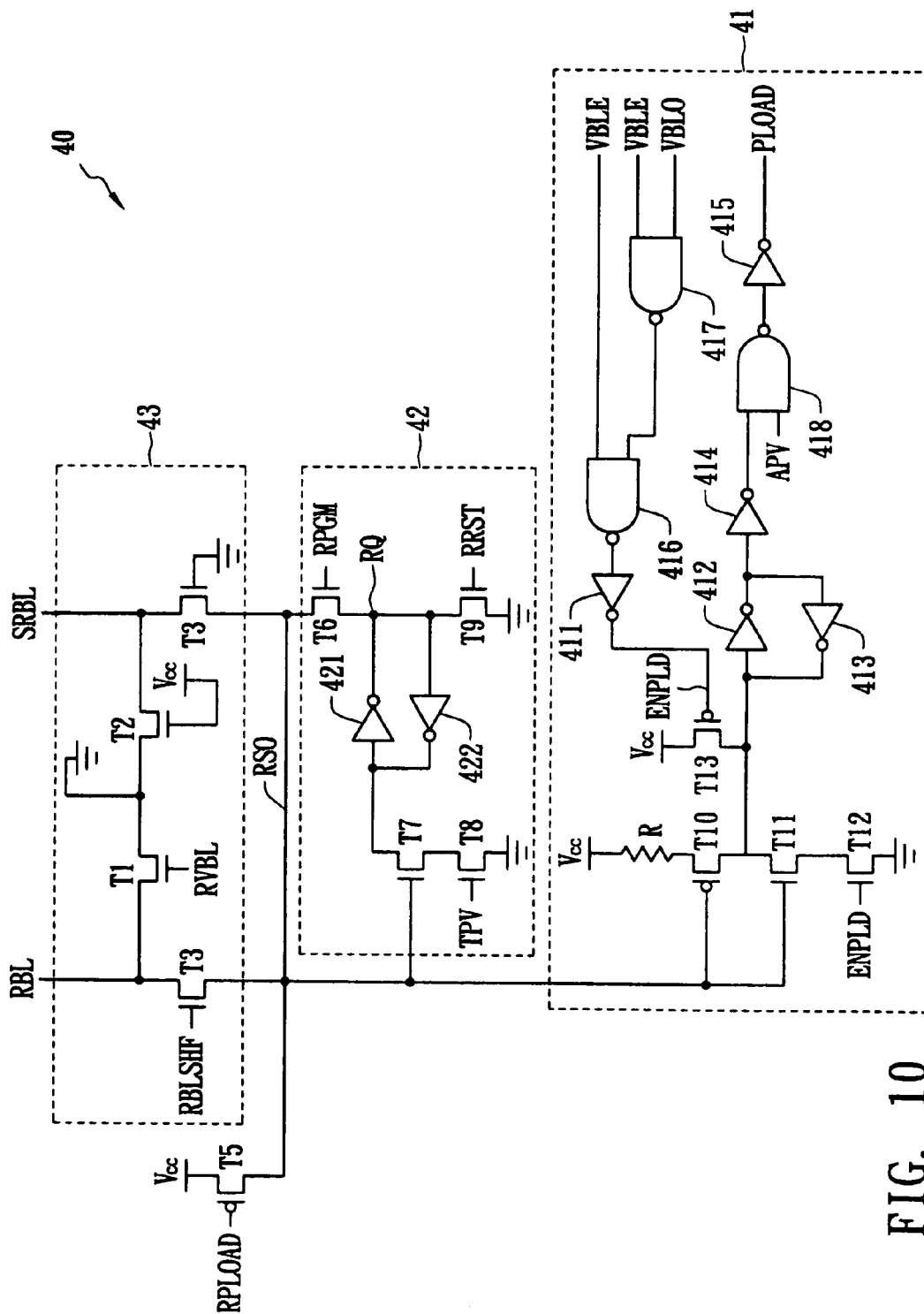
FIG. 10 shows an embodiment of the reference pager buffer used in the memory cell array of the present invention.

FIG. 10 shows an embodiment of the reference page buffer 40 used in the memory cell array of the present invention. The reference page buffer 40 comprises a reference bit line selection circuit 43, a trimming circuit 42 coupled to the source voltage $V_{cc}$ through the PMOS transistor T5 to determine the pre-trimmed threshold voltage distribution and a read ready circuit 41 coupled to the source voltage $V_{cc}$ to provide a first control signal PLOAD to the normal pager buffers. In the embodiment of the memory cell array 10 of FIG. 5, the reference page buffer 40 is coupled to each of the three reference bit lines RBL[1] through RBL[3], but only the first control signal PLOAD of the reference page buffer 40 coupled to the reference bit line RBL[1] is fed to each normal page buffer 40 coupled to the corresponding normal bit lines. The output signal of an inverter 414 of the reference page buffer 40 coupled to the respective reference bit line (RBL[1], RBL[2] or RBL[3]), is used to drive the first read signal R10, the second read signal R2 or the third read signal R01 with an external circuit (not shown), respectively.

Figure 11:
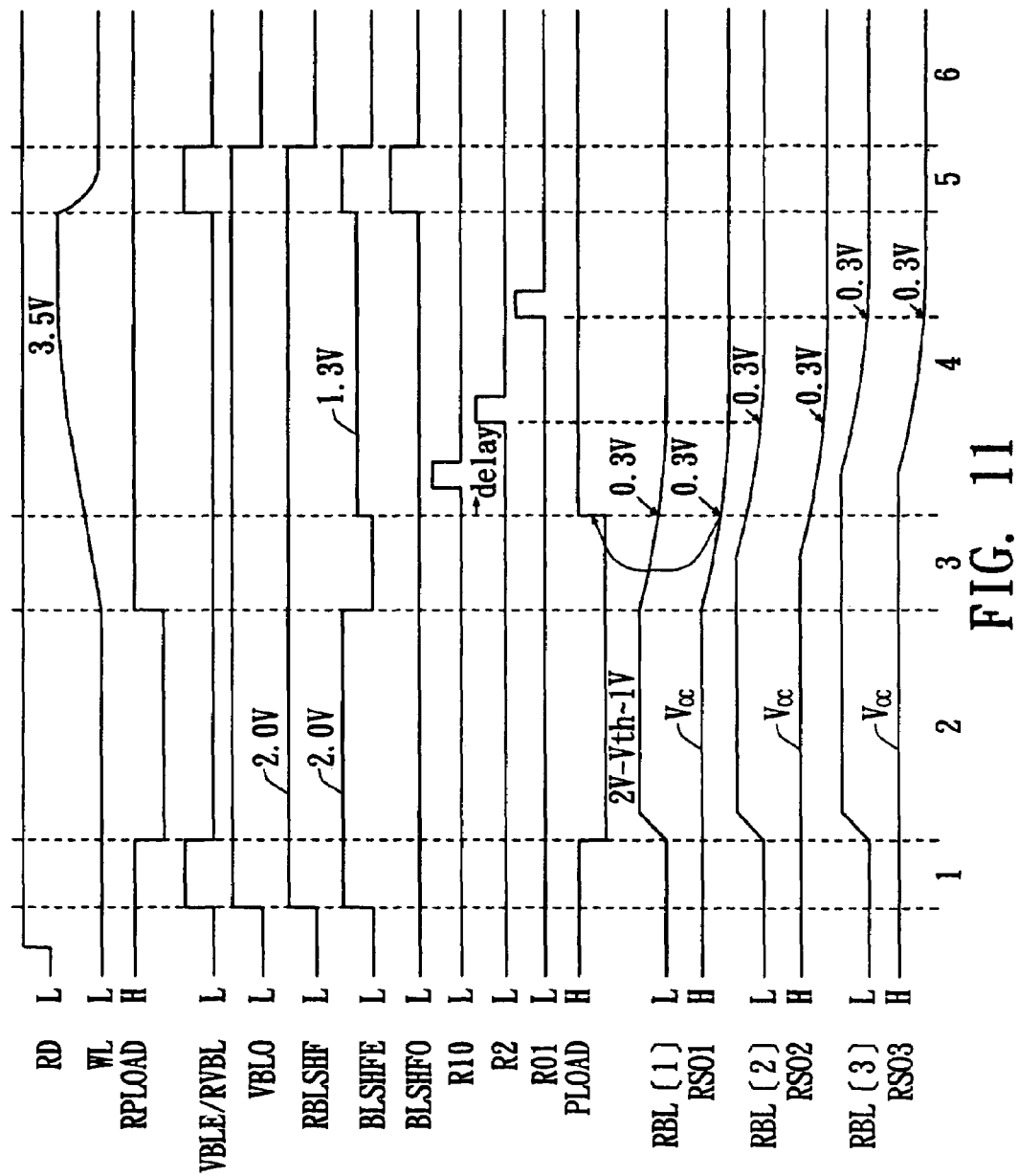
FIG. 11 is a timing chart of the signals regarding FIG. 9 and FIG. 10.

FIG. 11 is a timing chart of the signals regarding FIGS. 9 and 10. The method for reading a multi-level-cell NAND flash memory device having a plurality of normal cells of the present invention is described in detail in accordance with FIG. 11. Referring back to FIG. 6, assume that the reference cells RC associated with the reference page buffer RPB1, RPB2 and RPB3 are pre-trimmed with the threshold voltage distributions indicated by (A), (B) and (C), respectively. Referring to FIG. 9, before the read operation, a signal RESET goes high to reset all the normal cells and the latch state of the normal page buffer 30 is (11); that is, (Q2,Q1)=(0,0). In Region 1, assume an even normal bit line BLE is selected for reading. All the normal bit lines and the reference bit lines are discharged to the ground by activating high the signals VBLE, VBLO and RVBL. The signals BLSHFE and RBLSHF are also activated high to discharge node SO and RSO, respectively. In Region 2, the signal VBLO is kept at high state (i.e., $V_{cc}$) to ground the unselected bit line BLO as a shielding bit line. In the meantime, the transistor T2 is kept on to ground the shielding reference bit line SRBL. However, the signals VBLE and RVBL are activated low, and the signals PLOAD and RPLOAD are activated low to charge the nodes SO and RSO by the source voltage $V_{cc}$. The signals RBLSHF and BLSHFE are driven to about 2.0V and the signal BLSHFO is kept logic low to precharge the BLE and the RBL to a voltage level equal to 2.0V minus a threshold voltage of the transistors M3 and T3, respectively. Normally, the voltage level on the BLE and the RBL is about 1.0V. In Region 3, the signal RPLOAD is pulled high and the signal BLSHFE changes to a logic low state for the BLE with the normal cells under signal development. In the meantime, the signal RBLSHF remains at 2.0V and the selected normal word line voltage is ramped up slowly. The ramp-up rate of the selected normal word line voltage must be controlled to provide enough timing margin for sensing between two neighboring levels. For example, the selected normal word line is ramping up at 1V/2000 ns. The voltage margin between the states of (A) and (10) is 0.5V (refer to FIG. 1), and thus, the created timing margin is 1000 ns, which is enough to detect the normal cells in the states of (11) and (10). When the selected normal word line voltage is between 0.2V and 0.7V, the RBL[1] is discharged but the RBL[2] and the RBL[3] are not. The normal bit line associated with normal cells with the state of (11) is also discharged but the normal bit line associated with normal cells with the state of (10), ((01) or (00) is not. At the end of Region 3, the voltage level of the RBL[1] is discharged to 0.3V, the first control signal PLOAD is pulled to high state (i.e. the signal development is completed) according to the logic of the read ready circuit 41 (refer to FIG. 10). Note that when the voltage of the RBL[1] is discharged to 0.3V, the normal bit line associated with the normal cells with the state of (11) is discharged much more below 0.3V because of smaller threshold voltages of the normal cells with the state of (11) than that of the reference cells associated with the RBL[1]. In the meantime, the signal BLSFHE is pulled to 1.3V. In Region 4, the first read signal R10, the second read signal R2 and the third read signal R01 are activated in sequence by the external circuit and a time delay is designed optionally before the first read signal R10 is activated. The second read signal R2 and the third read signal R01 are activated by a predetermined voltage levels (e.g., 0.3V in the current embodiment) of the reference bit lines RBL[2] and RBL[3], respectively, like the first read signal R10.

Figure 12:
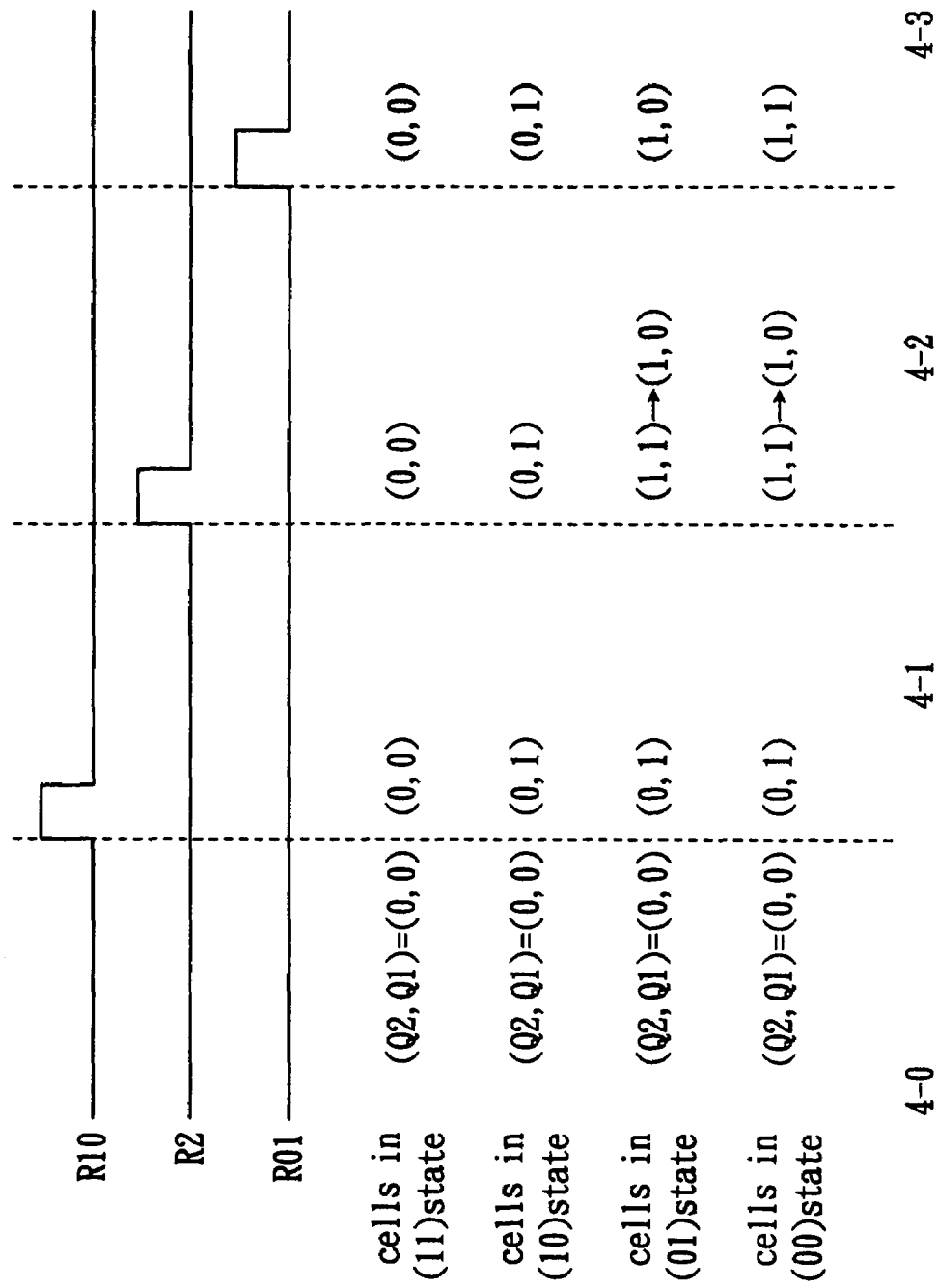
FIG. 12 shows four stages during Region 4 of FIG. 11.

FIG. 12 shows four stages during Region 4 to indicate the state transitions of the first and the second registers associated with the normal cells with four different states. In Stage 4-0, the registers Q2 and Q1 are in the logic low state. In Stage 4-1, the selected normal word line voltage is between 0.2V and 0.7V, turning on the normal cells with the state of (11), and a first read signal R10 is sent out to latch the Q1 state. If the normal cells to be read are in the state of (11) (i.e., (Q2, Q1)=(0,0)), the Q1 state is kept logic low; however, for the normal cells to be read in the state of (10), (01) or (00), the Q1 state changes from logic low to logic high (refer to Stage 4-1 of FIG. 12). When the selected normal word line voltage is between 1.5V and 2.0V, turning on the normal cells with the state of (10), the RBL[2] is discharged. When the RBL[2] is discharged to 0.3V, a second read signal R2 is sent to latch the Q2 state, the MSB of the two-bit data. If the accessed normal cells are in the state of ((01) or (00), the Q2 state thereof changes to logic high and then the Q1 state thereof is reset logic low. If the Q2 state is logic low, the Q1 state keeps its state and thus, the normal cells with the state of (11) or (10) are detected (refer to Stage 4-2 of FIG. 12). When the selected normal word line voltage is between 3.1V and 3.6V, turning on the normal cells with the state of ((01), the RBL[3] is discharged. When the RBL[3] is discharged to 0.3V, a third read signal R01 is sent to latch the Q1 state. If the Q2 state is logic high, the normal cells with the state of (01) or (00) can be determined. That is, the normal cells with the state of (00) cannot be turned on with the selected normal word line voltage of 3.1V to 3.6V and the node SO keeps at high state to turn on the transistor M10. When the third read signal R01 comes, the Q1 state changes to logic high (note that the Q2 state is high). However, for the normal cells with the state of (01), the node SO is discharged not to turn on the transistor M10, so the Q1 state will remain (refer to State 4-3 of FIG. 12). If the Q2 state is logic low, the Q1 state is not changed and thus the states of (11) and (10) are kept. From FIG. 12, the normal cells with the zero state (i.e., (11) state), the first state (i.e., (10) state) and the second state (i.e., (01) state) are read after the first read signal R10, the second read signal R2 and the third read signal R01 are activated, respectively. Also, the normal cells with the third state (i.e., (00) state) are read after the third read signal R01 is activated. In Region 5, the signals VBLE, VBLO, RVBL, BLSHFE, BLSHFO and RBLSHF are activated to logic high to turn on the transistors M1, M2, T1, M3, M4 and T3 to discharge the bit lines (BLE and BLO) and the reference bit line RBL. Also, the selected normal word line voltage is turned off. In Region 6, all the signals are turned off.

Figure 1:
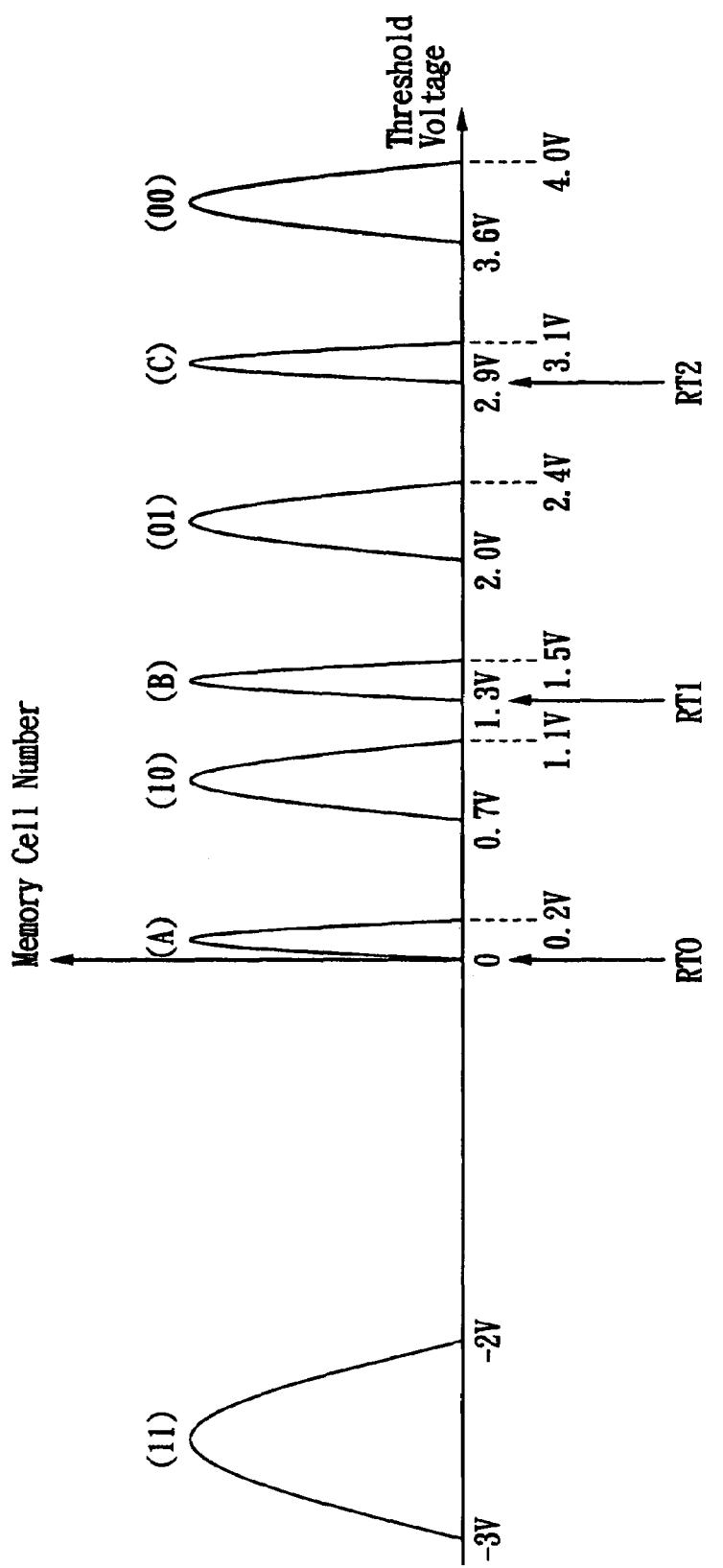
FIG. 1 shows a threshold voltage distribution of a memory cell according to programmed data.
Figure 2A:
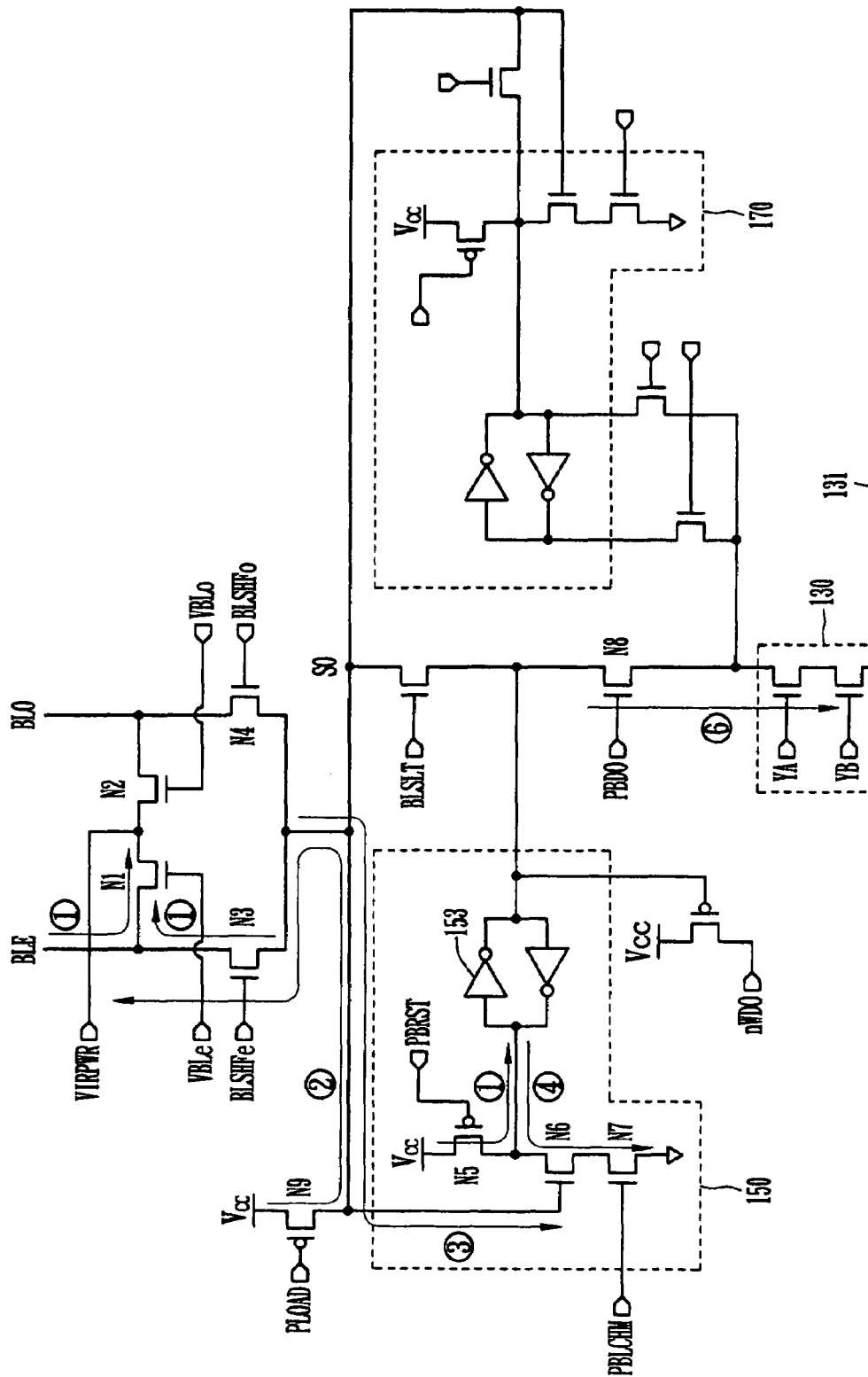
FIG. 2(a) shows a page buffer in a first prior art.
Figure 2B:
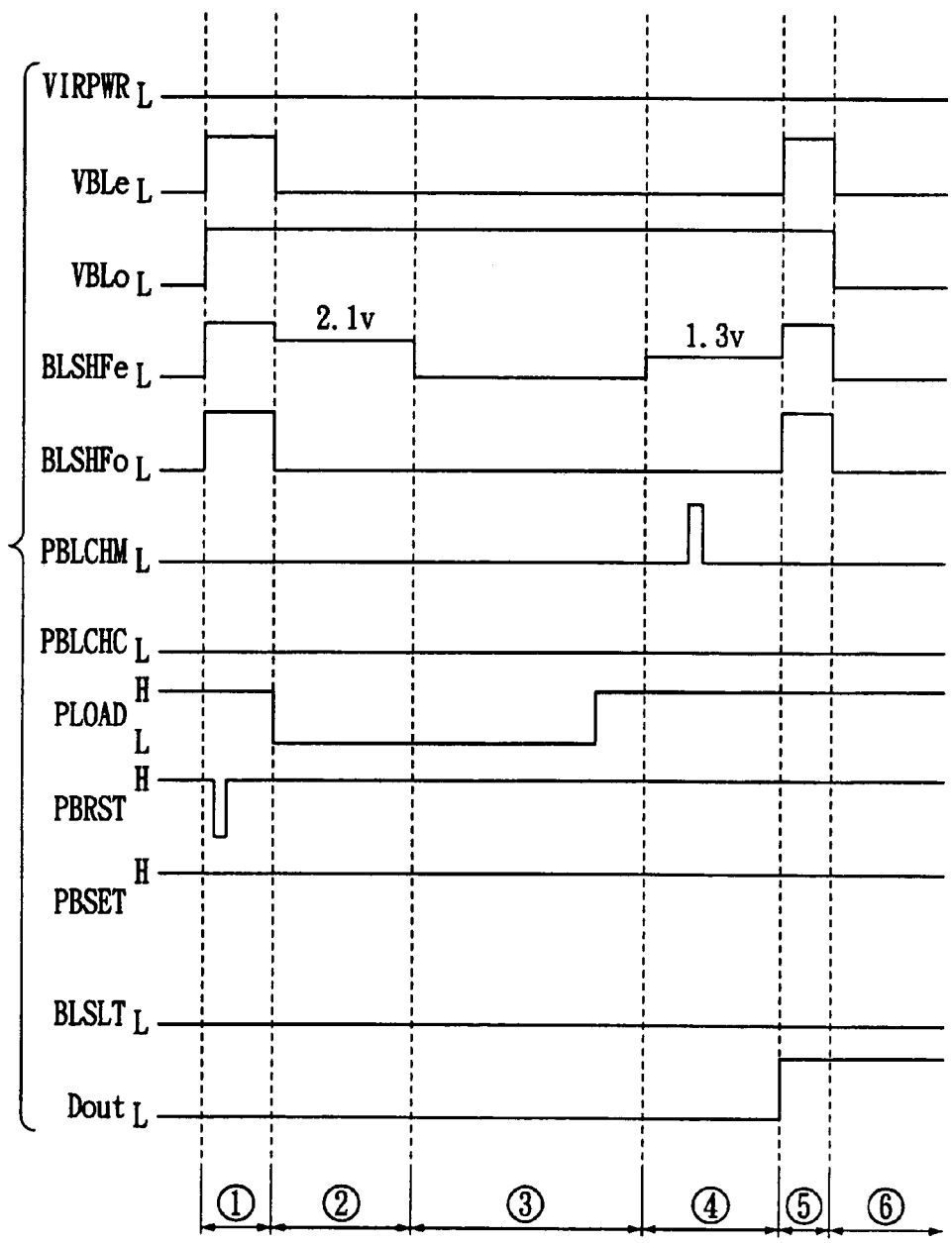
FIG. 2(b) shows a timing chart of signal commands regarding FIG. 2(a)
Figure 3:
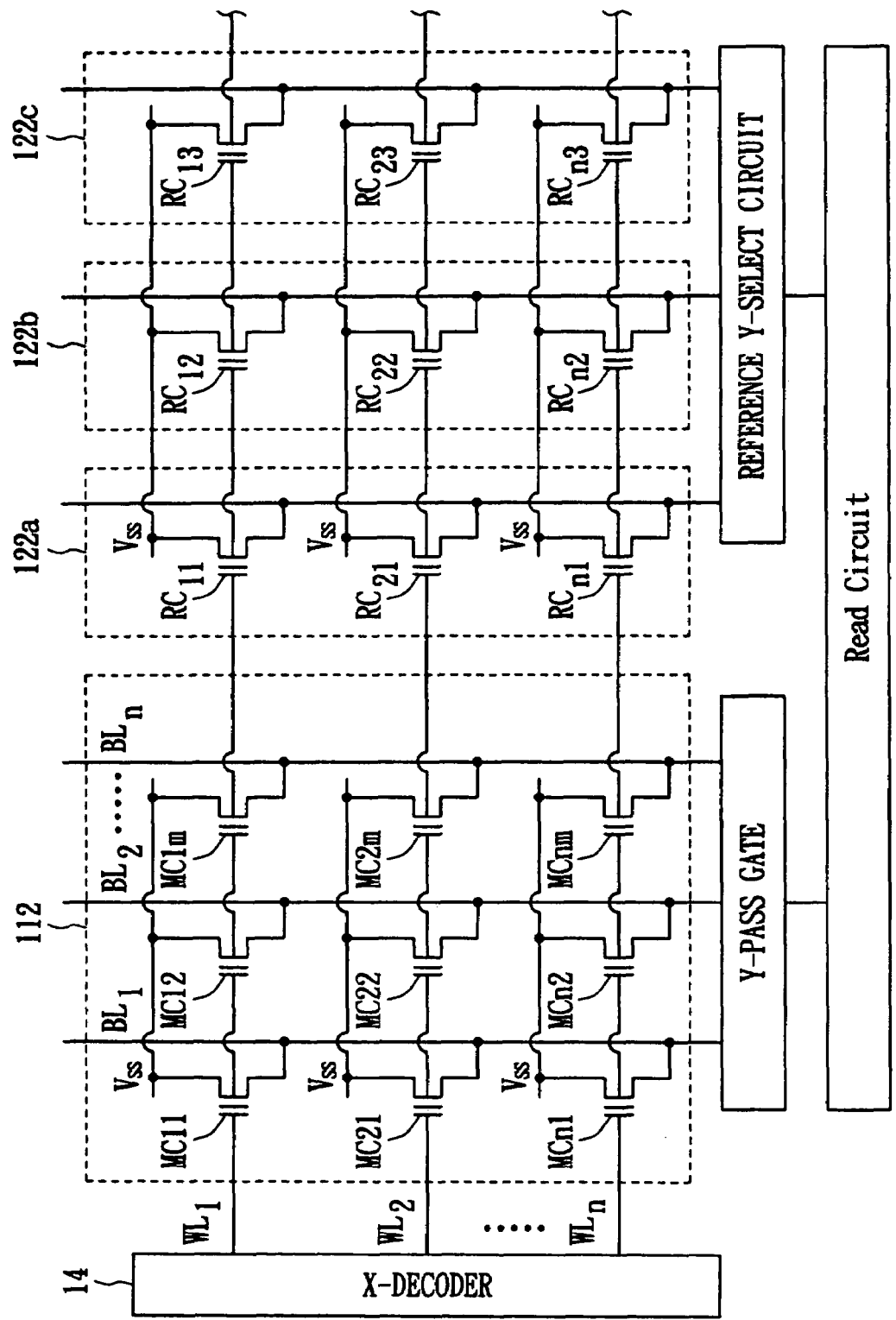
FIG. 3 shows a simplified block diagram of a read circuit in a second prior art.
Figure 4:
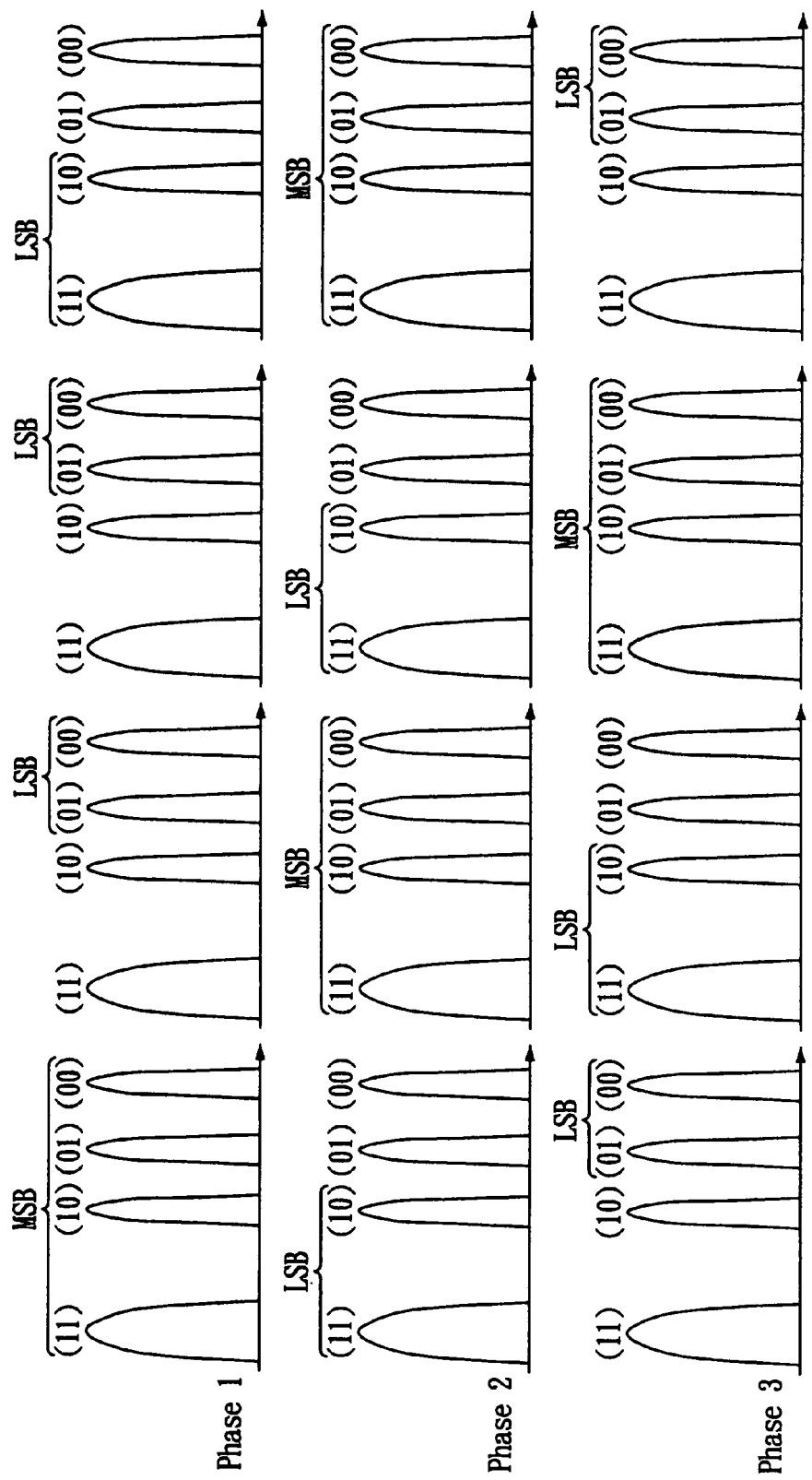
FIGS. 4(a) through 4(d) illustrate the reading sequences of the read operation of four prior arts.

The trimming procedure mentioned above to form the pre-trimmed threshold voltage distributions (i.e., the states of (A), (B) and (C) of FIG. 1), which is similar to the program operation and the program verify operation of the normal cells, comprises the steps of: (a) providing the reference cells in an erased state; (b) trimming the reference cells associated with a reference bit line; (c) verifying the reference cells associated with the reference bit line; and (d) repeating Steps (b) and (c) until the reference cells associated with the reference bit line are trimmed. Referring to FIG. 10, at Step (b), a signal RRST is activated to a pulse high to set a node RQ to a logic low state and then the signals RPGM and RBLSHF are activated to logic high to pass the voltage level of the node RQ to the reference bit line RBL. Note that if the node RQ is in a logic high state, the trimming (or program) of the reference cells associated with the reference bit line RBL is inhibited; if the node RQ is in a logic low state, the trimming thereof is allowed. At Step (c), the signal TPV is kept to logic high during the program verify operation to latch the state of the reference cell. If the reference cell is programmed to a threshold voltage larger than the selected reference word line voltage, the reference bit line RBL will not be discharged and the state of the node RQ switches from logic low to logic high. Thus, the further program is inhibited for the reference cell. For the reference cells on the three reference bit lines RBL[1] through RBL[3] have the voltage levels of RT0, RT1 and RT2 (refer to FIG. 1) applied on the selected reference word line, respectively, during program verification. Once the verification of the reference cell passes, the node RQ associated is set to logic high and further program is inhibited. The voltage levels of RT0, RT1 and RT2 are applied on the selected reference word line one by one. Also, the program time of one shot in the trimming procedure is controlled to confine the threshold voltage distribution to a narrow range.

The above-described embodiments of the present invention are intended to be illustrative only. Numerous alternative embodiments may be devised by those skilled in the art without departing from the scope of the following claims.

What is claimed is:

1. A method for reading a NAND flash memory device having a plurality of normal cells, the method comprising the steps of:
   ramping up a selected word line voltage in a predetermined period; and
   reading the normal cells with a zero state, a first state, a second state and a third state in the predetermined period;
   wherein each of the zero state, the first state, the second state and the third state indicates a two-bit data stored in each of the normal cells.

2. The method for reading a NAND flash memory device of claim 1, wherein the normal cells with the zero state, the first state and the second state are read after a first read signal, a second read signal and a third read signal are activated, respectively.

3. The method for reading a NAND flash memory device of claim 2, wherein each of the first read signal, the second read signal and the third read signal is driven by a reference page buffer.

4. The method for reading a NAND flash memory device of claim 3, further comprising the step of grounding a shielding reference bit line for the reference page buffer.

5. The method for reading a NAND flash memory device of claim 3, wherein the reference page buffer is coupled to a plurality of reference cells connected in series and the reference cells exhibit a pre-trimmed threshold voltage distribution.

6. The method for reading a NAND flash memory device of claim 5, further comprising a trimming procedure to form the pre-trimmed threshold voltage distribution, the trimming procedure comprising the steps of:
   (a) providing the reference cells in an erased state;
   (b) trimming the reference cells associated with a reference bit line;
   (c) verifying the reference cells associated with the reference bit line; and
   (d) repeating Steps (b)-(c) until the reference cells associated with the reference bit line are trimmed.

7. The method for reading a NAND flash memory device of claim 5, wherein the pre-trimmed threshold voltage distribution is controlled by a trimming circuit in the reference page buffer.

8. The method for reading a NAND flash memory device of claim 2, wherein each of the first read signal, the second read signal and the third read signal is activated by a predetermined voltage level on respective reference bit lines thereof.

9. The method for reading a NAND flash memory device of claim 2, wherein the normal cells with the third state are read after the third read signal is activated.

10. The method for reading a NAND flash memory device of claim 1, wherein the normal cells with the zero state, the first state and the second state are read in sequence.

11. The method for reading a NAND flash memory device of claim 1, wherein the step of ramping up the selected word line voltage in the predetermined period comprises the steps of:
    turning on the normal cells with the zero state;
    turning on the normal cells with the first state; and
    turning on the normal cells with the second state.

12. A memory cell array used in a NAND flash memory device, comprising:
    a plurality of normal cell blocks arranged in parallel, each normal cell block comprising a plurality of normal cells, each normal cell exhibiting one of a zero state, a first state, a second state and a third state;
    a plurality of reference cell blocks interleaved between the normal cell blocks;
    a plurality of normal bit lines coupled to each of the normal cell blocks and coupled to a plurality of normal page buffers;
    a plurality of reference bit lines coupled to each of the reference cell blocks and coupled to a plurality of reference page buffers; and
    a voltage generator generating a ramp-up word line voltage applied on a selected word line in a predetermined period;
    wherein the normal cells associated with the selected word line exhibiting the zero state, the first state, the second state and the third state are read in the predetermined period.

13. The memory cell array of claim 12, wherein each normal page buffer is coupled to two of the normal bit lines, and one of the two of the normal bit lines acts as a shielding bit line.

14. The memory cell array of claim 13, wherein each normal page buffer comprises:
- a bit line selection circuit determining the shielding bit line and;
- a first register and a second register latching a two-bit data storing in the associated normal cell; and
- a first control circuit and a second control circuit outputting the two-bit data to a first output circuit and a second output circuit, respectively, according to a first read signal, a second signal and a third signal.

15. The memory cell array of claim 12, wherein each reference page buffer is coupled to two of the reference bit lines, and one of the two reference bit lines acts as a shielding reference bit line.

16. The memory cell array of claim 15, wherein the reference cell blocks comprise a plurality of reference cells divided into three groups, each group of the reference cells coupled to the associated reference page buffer through the associated reference bit line.

17. The memory cell array of claim 16, wherein each group of the reference cells exhibits a pre-trimmed threshold voltage distribution that distinguishes the threshold voltage distributions of the zero, the first, the second and the third states.

18. The memory cell array of claim 17, wherein each reference page buffer comprises:
- a trimming circuit coupled to the reference bit line selection circuit and the source voltage to determine the pre-trimmed threshold voltage distribution; and
- a read ready circuit coupled to the source voltage to provide a first control signal to the normal page buffers.

19. The memory cell array of claim 18, wherein the first control signal enables a read operation of the normal cells associated with the selected word line exhibiting the zero state, the first state, the second state and the third state.

20. The memory cell array of claim 12, wherein the voltage generator comprises:
- a voltage source generating a first voltage;
- a voltage equalizer providing the ramp-up word line voltage equalized by the first voltage;
- a plurality of voltage selectors sending the ramp-up word line voltage to the selected word line and to an assigned reference world line, and sending a pass word line voltage to a plurality of pass word lines and to unassigned reference world lines according to a plurality of word line selection signals; and
- a global word line decoder receiving a global word line address and outputting the word line selection signals.

21. The memory cell array of claim 20, wherein the voltage source comprises:
- a capacitor connecting to the ground with a first node; and
- a current source charging the capacitor through a second node to generate the first voltage at the second node.

22. The memory cell array of claim 20, wherein the voltage equalizer comprises:
- a comparator comparing the ramp-up word line voltage with the first voltage; and
- an inverter receiving the output of the comparator to equalize the ramp-up word line voltage and the first voltage.

23. The memory cell array of claim 12, wherein the physical layouts of each reference bit line, each shielding reference bit line and the reference cells thereof are identical to those of each normal bit line and the normal cells thereof.

* * * * *